US011962320B2

United States Patent
Azadet et al.

(10) Patent No.: US 11,962,320 B2
(45) Date of Patent: Apr. 16, 2024

(54) SEMICONDUCTOR CHIP PROVIDING ON-CHIP SELF-TESTING OF AN ANA-LOG-TO-DIGITAL CONVERTER IMPLEMENTED IN THE SEMICONDUCTOR CHIP

(71) Applicant: Intel Corporation, Santa Clara, CA (US)

(72) Inventors: Kameran Azadet, San Ramon, CA (US); Martin Clara, Santa Clara, CA (US); Daniel Gruber, St. Andrae (AT); Albert Molina, Novelda (ES); Hundo Shin, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/753,917

(22) PCT Filed: Dec. 23, 2019

(86) PCT No.: PCT/US2019/068240
§ 371 (c)(1),
(2) Date: Mar. 18, 2022

(87) PCT Pub. No.: WO2021/133372
PCT Pub. Date: Jul. 1, 2021

(65) Prior Publication Data
US 2022/0345144 A1    Oct. 27, 2022

(51) Int. Cl.
*H03M 1/10*    (2006.01)
*G01R 31/28*    (2006.01)
(Continued)

(52) U.S. Cl.
CPC ...... *H03M 1/1071* (2013.01); *G01R 31/2856* (2013.01); *G01R 31/3187* (2013.01);
(Continued)

(58) Field of Classification Search
CPC .. H03M 1/1071; H03M 1/0854; H03M 1/462; G01R 31/2856; G01R 31/3187; G01R 31/26
See application file for complete search history.

(56) References Cited

U.S. PATENT DOCUMENTS

| | | | |
|---|---|---|---|
| 7,528,754 B1 | 5/2009 | Bakkaloglu et al. | |
| 8,510,073 B2 * | 8/2013 | Dasnurkar | H03M 1/109 702/117 |

(Continued)

FOREIGN PATENT DOCUMENTS

| | | |
|---|---|---|
| JP | 2010016724 A | 1/2010 |
| WO | 2009153766 A1 | 12/2009 |

OTHER PUBLICATIONS

Ting et al.: A Time Domain Built-In Self-Test Methodology for SNDR and ENOB Tests of Analog-to-Digital Converters; Proceedings of the 13th Asian Test Symposium (ATS 2004).

(Continued)

*Primary Examiner* — Joseph J Lauture
(74) *Attorney, Agent, or Firm* — 2SPL Patent Attorneys PartG mbB; Kieran O'Leary (57) ABSTRACT

A semiconductor chip providing on-chip self-testing of an Analog-to-Digital Converter, ADC, implemented in the semiconductor chip is provided. The semiconductor chip comprises the ADC and a Digital-to-Analog Converter, DAC, configured to generate and supply a radio frequency test signal to the ADC via a supply path. The ADC is configured to generate digital output data based on the radio frequency test signal. The semiconductor chip further comprises a reference data generation circuit configured to generate digital reference data. Additionally, the semiconductor chip comprises a comparator circuit configured to
(Continued)

compare the digital output data to the digital reference in order to determine error data.

25 Claims, 7 Drawing Sheets

(51) Int. Cl.
  *G01R 31/3187* (2006.01)
  *G01R 31/26* (2020.01)
  *H03M 1/08* (2006.01)
  *H03M 1/46* (2006.01)

(52) U.S. Cl.
  CPC ........... *G01R 31/26* (2013.01); *H03M 1/0854* (2013.01); *H03M 1/462* (2013.01)

(56) References Cited

U.S. PATENT DOCUMENTS

| | | | | |
|---|---|---|---|---|
| 2013/0021048 | A1* | 1/2013 | Peng | G01R 31/2822 |
| | | | | 324/750.3 |
| 2016/0094238 | A1* | 3/2016 | Kang | H03M 1/109 |
| | | | | 341/120 |
| 2019/0372581 | A1* | 12/2019 | Jang | H03M 1/0854 |

OTHER PUBLICATIONS

Lee et al.: A Sigma-Delta Modulation Based BIST Scheme for A/D Converters; Proceedings of the 12th Asian Test Symposium (ATS 2003).

* cited by examiner

SEMICONDUCTOR CHIP PROVIDING ON-CHIP SELF-TESTING OF AN ANA-LOG-TO-DIGITAL CONVERTER IMPLEMENTED IN THE SEMICONDUCTOR CHIP

FIELD

The present disclosure relates to on-chip self-testing of an Analog-to-Digital Converter (ADC). In particular, examples relate to a semiconductor chip providing on-chip self-testing of an ADC implemented in the semiconductor chip, a method for on-chip self-testing of an ADC, a receiver, a base station and a mobile device.

BACKGROUND

Test time is a significant cost component in high volume manufacturing of ADCs. It conventionally requires an expensive and specialized Radio Frequency (RF) analog test set-up in a manufacturing test facility.

Hence, there may be a desire for improved ADC testing.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
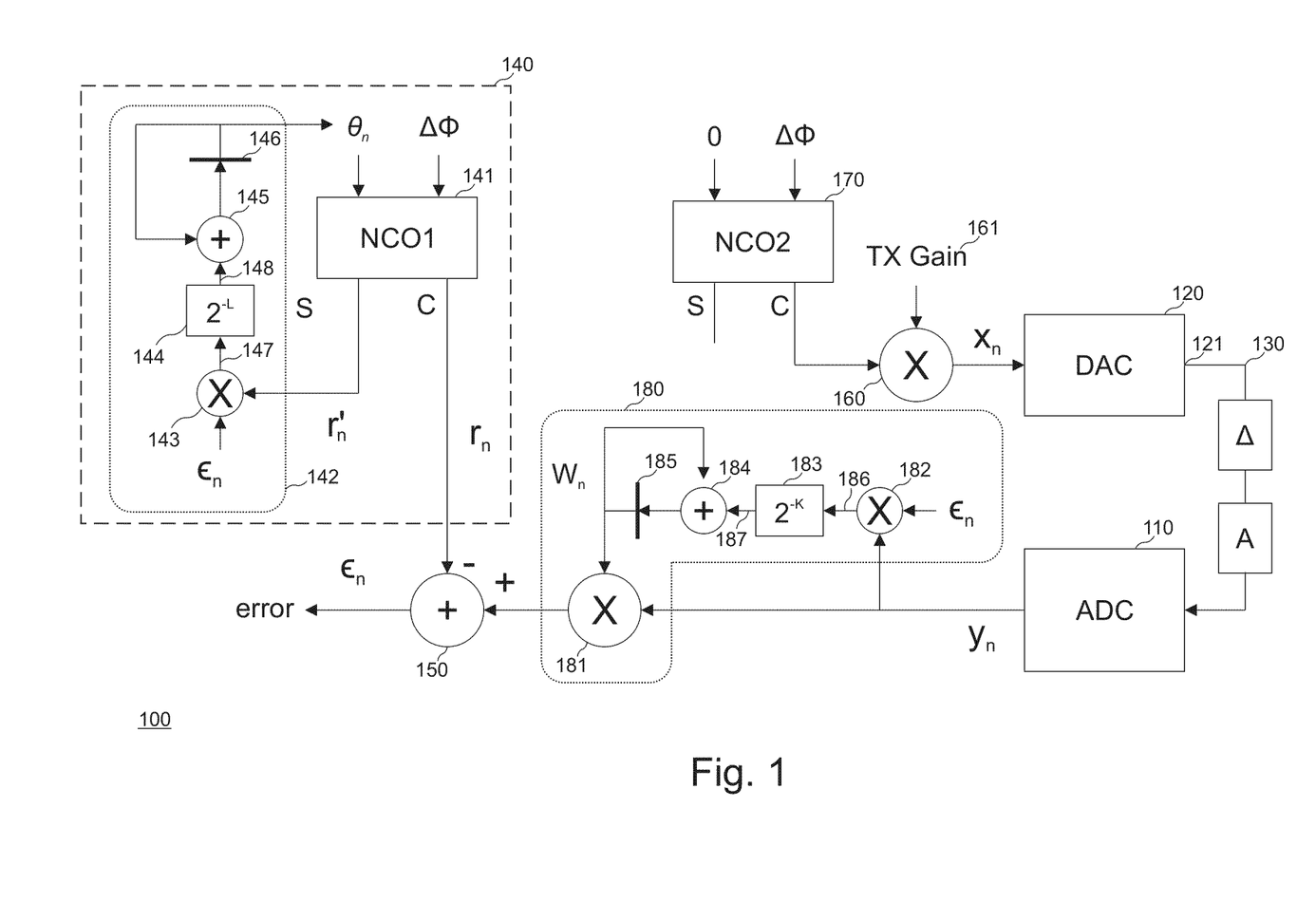
FIG. 1 illustrates a first example of a semiconductor chip providing on-chip self-testing of an ADC implemented in the semiconductor chip.

FIG. 1 illustrates an example of a semiconductor chip (die) 100 providing on-chip self-testing of an ADC 110 implemented in the semiconductor chip 100.

The semiconductor chip 100 comprises apart from the ADC 110 a Digital-to-Analog Converter (DAC) 120. The DAC 120 is configured to generate and supply a RF test signal 121 to the ADC via a supply path 130. The supply path 130 may be an on-chip path or be at least in part off-chip. The ADC 110 is configured to generate digital output data $y_n$ based on the RF test signal 121.

The semiconductor chip 100 additionally comprises a reference data generation circuit 140 configured to generate digital reference data $r_n$. The digital reference data $r_n$ are expected/target output data of the ADC 110 for the RF test signal 121.

Further, the semiconductor chip 100 comprises a comparator circuit 150 configured to compare the digital output data $y_n$ of the ADC 110 to the digital reference data $r_n$ in order to determine (quantization) error data $\in_n$ indicative of a quantization error of the ADC 110.

The DAC 120 together with the reference data generation circuit 140 and the comparator circuit 150 enable a Built-In Self Test (BIST) functionality of the semiconductor chip 100 for the ADC 110. The error data $\in_n$ allow to indicate with high precision the accuracy of the RFADC 110. The semiconductor chip 100 may enable a simple pass-fail test for the dynamic performance of the ADC 110. Accordingly, the ADC 110 may be tested during manufacturing without the need for expensive external test equipment. The BIST functionality of the semiconductor chip 100 for the ADC 110 may enable to reduce the test time during manufacture by an order of magnitude or more (e.g. from about one minute to less than one second). Therefore, the semiconductor chip 100 may enable high-performance self-testing at wafer-level probe testing during high volume manufacturing.

Figure 2:
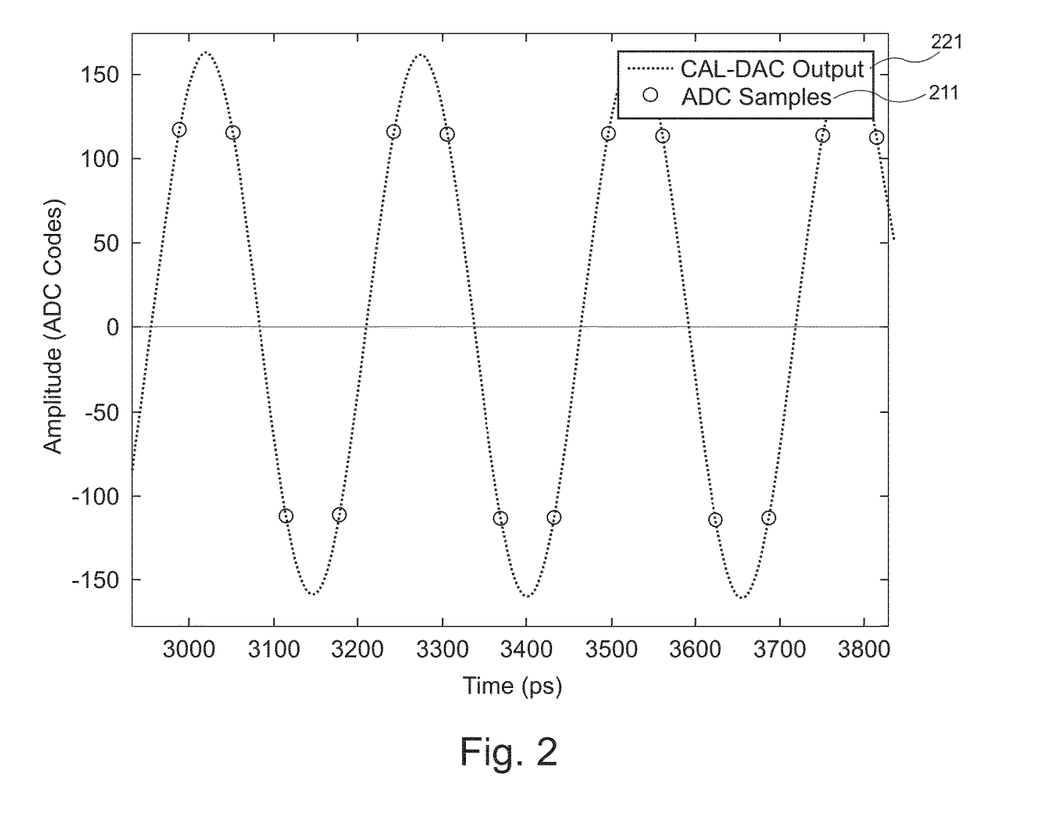
FIG. 2 illustrates an example of a RF test signal.

According to some examples, the DAC 120 may be a 1-bit DAC with a mixed-signal Finite Impulse Response (FIR) filter output stage. Using a 1-bit DAC with a mixed-signal FIR filter output stage may allow to generate the RF test signal 121 with high spectral purity. For example, the RF test signal 121 may be a sinusoidal signal as illustrated in FIG. 2. FIG. 2 illustrates a sinusoidal RF test signal 221 as output by a 1-bit DAC with mixed-signal FIR filter output stage. However, it is to be noted that proposed technique is not limited to using a 1-bit DAC with a mixed-signal FIR filter output stage for generating a sinusoidal RF test signal. In general, any DAC may be used for generating any desired RF test signal.

The DAC 120 is configured to generate the RF test signal 121 based on digital control data $x_n$. The digital control data $x_n$ may, e.g., a sequence such as 11001100 . . . (i.e. a repetition of the sequence 1100) in order to generate a square wave signal that is sharply filtered by the mixed-signal FIR filter output stage of a 1-bit DAC in order to generate the sinusoidal RF test signal 221 with high spectral purity. Further illustrated in FIG. 2 are samples 211 of the digital control data $x_n$ input to the 1-bit DAC (e.g. representing 11001100). The mixed-signal FIR filter output stage allows to weight delayed 1-bit signals by current sources, capacitors or resistors in order to produce an RF signal that is a filtered version of the input 1-bit signal. By inputting the bit sequence 11001100 . . . , a square wave signal at $F_s/4$ ($F_s$ denotes the sampling frequency of the DAC) is generated, wherein harmonics at $k \cdot F_s/4$ are filtered due to the low pass filter characteristic of the FIR filter output stage such that a highly pure sinewave is generated by the DAC.

Figure 3:
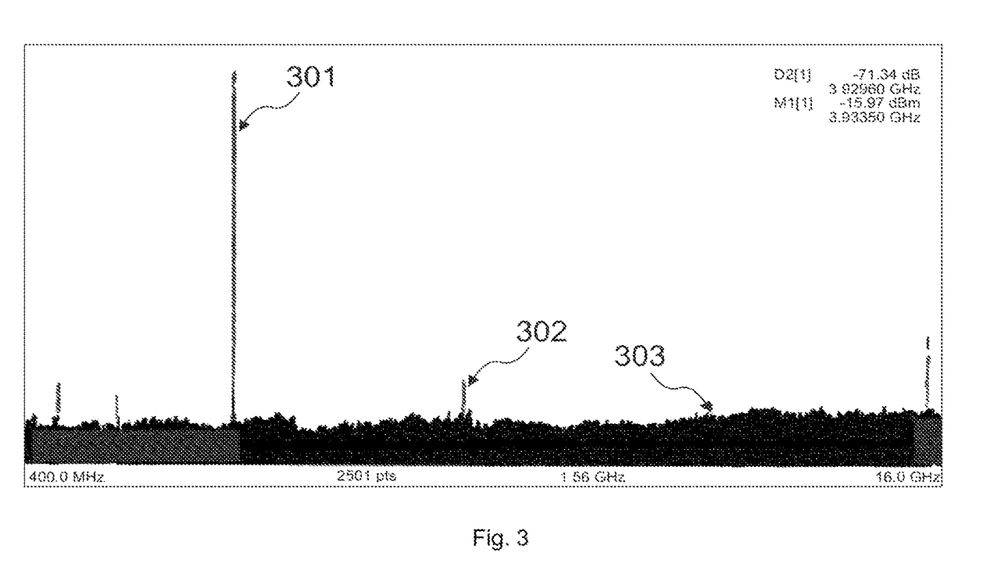
FIG. 3 illustrates an exemplary spectrum of a RF test signal.

An exemplary spectrum 300 of the sinusoidal RF test signal 221 generated by a 1-bit DAC with mixed-signal FIR filter output stage is illustrated in FIG. 3. As can be seen from FIG. 3, the sinusoidal RF test signal 221 comprises a desired peak at about 4 GHz. Further, the second order harmonic distortion 302 at about 8 GHz is highly suppressed compared to the peak 301 (e.g. a signal power of the second order harmonic distortion 302 may be less than −50 dBc, −60 dBc, −70 dBc, etc.). The second order harmonic distortion 303 at about 12 GHz is not visible, i.e. not distinguishable from the signal noise. Using a 1-bit DAC with mixed-signal FIR filter output stage may allow to provide a RF test signal with a Total Harmonic Distortion (THD)>50 dB, 60 dB, 70 dB, etc.

Returning back to FIG. 1, the semiconductor chip 100 comprises a Numerically Controlled Oscillator (NCO) 170 configured generating the digital control data $x_n$ based on frequency control data $\Delta\Phi$. Optionally, a modification circuit 160 may be coupled between the NCO 170 and the DAC 120 for modifying the digital control data $x_n$ based on gain control data 161 indicating a desired/target signal gain for the RF test signal 121. However, it is to be noted that the NCO 170 is merely an example for circuitry for providing the digital control data $x_n$ for controlling the DAC 120. In general, any circuitry capable of providing such data may be used. For example, a data generation circuit configured to generate a data pattern such as a random pattern or a pseudorandom pattern as digital control data may be used instead of the NCO 170. Therefore, in some examples, the RF test signal 121 may be a non-sinusoidal test signal.

As indicated in FIG. 1, the supply path 130 causes a signal gain A and a delay of the RF test signal 121 by a signal propagation delay $\Delta$. The signal gain A of the supply path 130 and/or the signal propagation delay $\Delta$ over the supply path 130 may be compensated in order to improve the precision of the BIST for the ADC 110.

First, the compensation of the signal gain A of the supply path 130 will be described. The semiconductor chip 100 comprises a gain correction circuit 180 coupled between the ADC 110 and the comparator circuit 150. The gain correction circuit 180 is configured to modify, based on gain correction data $W_n$, the digital output data $y_n$ in order to compensate for the signal gain A of the supply path 130. For example, the gain correction circuit 180 may comprise a multiplier circuit 181 configured to multiply the digital output data $y_n$ with the gain correction data $W_n$ in order to compensate for the signal gain A of the supply path 130.

The gain correction circuit 180 is further configured to determine the gain correction data $W_n$ based on the error data $\epsilon_n$ and the digital output data $y_n$. For determining the gain correction data $W_n$, the gain correction circuit 180 comprises another multiplier circuit 182 configured to correlate (combine) a sample of the error data $\epsilon_n$ with a sample of the digital output data $y_n$ in order to obtain a first sample 186. Further, the gain correction circuit 180 comprises a bit-shifter 183 (e.g. a barrel shifter or a hard-wired shifter) configured to bit-shift the first sample 186 by a predetermined bit value. A sample of the gain correction data $W_n$ is obtained by means of a combiner circuit 184 configured to combine the bit-shifted first sample 187 with a preceding (previously generated) sample of the gain correction data $W_{n-1}$.

The above described generation of the sample of the gain correction data $W_n$ may be summarized by the following mathematical expression:

$$W_n = W_{n-1} - \mu_W \epsilon_n y_n \qquad (1)$$

In mathematical expression (1), $\mu_W$ denotes the bit-shift applied by the bit-shifter 183. Further, it is assumed that $W_0 = 0$. After convergence, gain correction data will be $$W = \frac{1}{A} \qquad (2)$$

such that the signal gain A of the supply path 130 is compensated in the digital output data $y_n$. Prior to combining the digital output data $y_n$ with the gain correction data $W_n$, the sample of the gain correction data $W_n$ is delayed by one sample period by means of delay circuit 185.

In order to match the signal propagation delay $\Delta$ over the supply path 130, the reference data generation circuit 140 is configured to generate the digital reference data $r_n$ taking into account the signal propagation delay $\Delta$ over the supply path 130. In particular, the digital reference data $r_n$ is phase shifted in order to match the signal propagation delay $\Delta$ over the supply path 130.

The reference data generation circuit comprises an NCO 141 configured to generate the digital reference data $r_n$ based on frequency control data $\Delta\Phi$ and signal propagation delay data $\theta_n$ indicative of the signal propagation delay $\Delta$ over the supply path 130. Both, the NCO 170 providing the digital control data $x_n$ for the DAC 120 as well as the NCO 141 generating the digital reference data $r_n$ receive the frequency control data $\Delta\Phi$ as input. In order to compensate for the signal propagation delay $\Delta$ over the supply path 130 (the delay $\Delta$ may be fractional relative to the clock period of the ADC 110), the signal propagation delay data $\theta_n$ are input to the NCO 141 for adjusting the required phase shift of the digital reference data $r_n$ with respect to the digital output data $y_n$.

Figure 4:
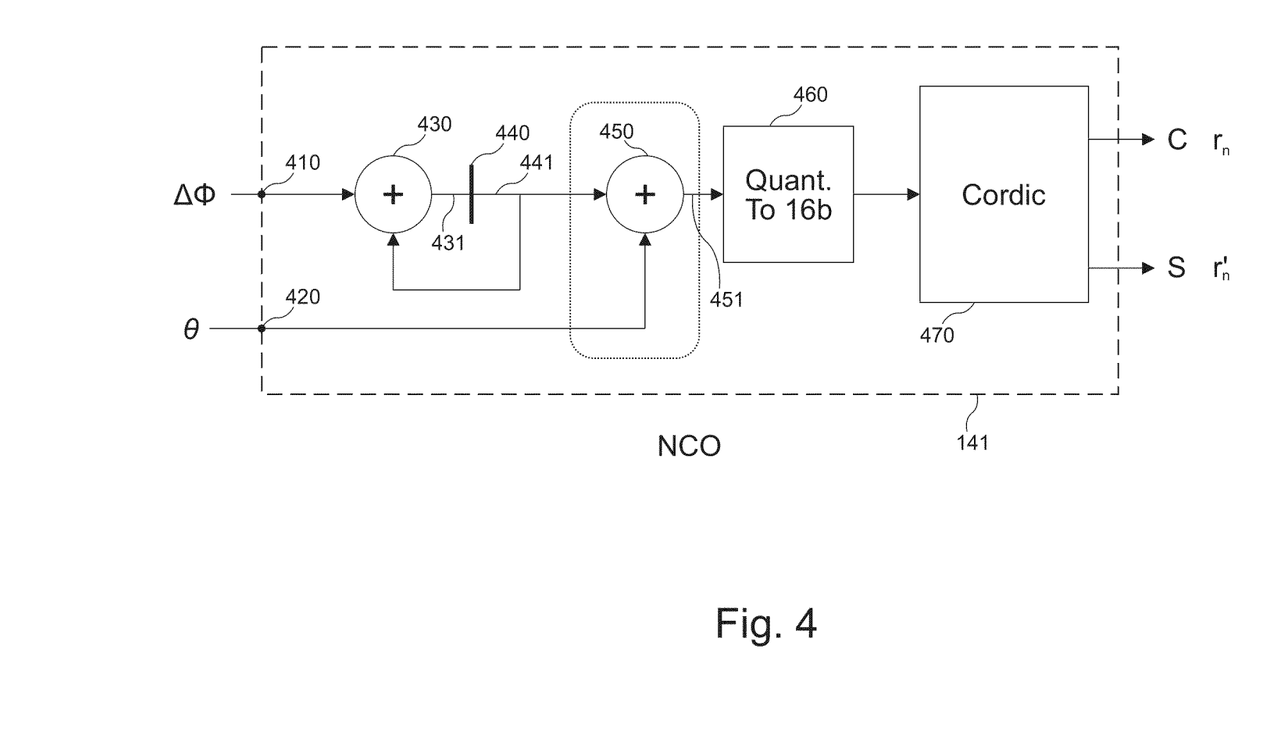
FIG. 4 illustrates an example of a numerically controlled oscillator.

An exemplary implementation of the NCO 141 is illustrated in FIG. 4. The NCO 141 comprises a first input node 410 for the frequency control data $\Delta\Phi$, and a second input 420 for the signal propagation delay data $\theta_n$.

Additionally, the NCO 141 comprises a first combiner circuit 430 configured to combine a sample of the frequency control data $\Delta\Phi$ with a phase accumulation sample in order to generate an updated phase accumulation sample 431. The phase accumulation sample is an accumulation of preceding (previously input) samples of the frequency control data ΔΦ. In other words, the NCO 141 uses an input phase accumulator. A delay circuit 440 is configured to delay the updated phase accumulation sample 431. The resulting delayed updated phase accumulation sample 441 is fed back to the first combiner circuit 430 for combination with the succeeding sample of the frequency control data ΔΦ.

Further, the delayed updated phase accumulation sample 441 is fed to a second combiner circuit 450 of the NCO 141. The second combiner circuit 450 is configured to combine a sample of the signal propagation delay data as a phase shift $\theta_n$ and the delayed updated phase accumulation sample 441 in order to generate a control sample 451 for a COordinate Rotation DIgital Computer (CORDIC) circuit 470 of the NCO 141. A quantizer circuit 460 is coupled between the second combiner circuit 450 and the CORDIC circuit 470 for quantizing the control sample 451 to a desired/target bit resolution.

The CORDIC circuit 470 runs a CORDIC algorithm and is configured to generate the digital reference data $r_n$ based on the control sample 451. The CORDIC circuit 470 converts the phase information given in the control sample 451 to an amplitude of the digital reference data $r_n$. In other words, the CORDIC circuit 470 is an example for a phase-to-amplitude conversion circuit. In addition, the CORDIC circuit 470 is further configured to generate a phase shifted replica $r'_n$ of the reference signal. The phase shifted replica $r'_n$ of the digital reference data is phase-shifted by 90° with respect to the digital reference data $r_n$. The digital reference data $r_n$ represent the same waveform as the RF test signal 121 (e.g. a sinusoidal waveform).

For adapting the signal propagation delay data $\theta_n$, the reference data generation circuit 140 further comprises loop circuitry 142. The loop circuitry 142 is configured to generate the signal propagation delay data $\theta_n$ based on the error data $\in_n$ and the phase shifted replica $r'_n$ of the digital reference data output by the NCO 141.

The loop circuitry 142 comprises a multiplier circuit 143 configured to combine a sample of the error data $\in_n$ and a sample of the phase shifted replica $r'_n$ of the digital reference data in order to obtain a second sample 147. Further, the loop circuitry 142 comprises a bit-shifter 144 (e.g. a barrel shifter) configured to bit-shift the second sample 147 by a predetermined bit value. A sample of the signal propagation delay data $\theta_n$ is obtained by combining the bit-shifted second sample 148 with a preceding (previously generated) sample of the signal propagation delay data $\theta_{n-1}$.

The above described generation of the sample of the signal propagation delay data $\theta_n$ may be summarized by the following mathematical expression:

$$\theta_n = \theta_{n-1} - \mu_W \in_n r'_n \qquad (3)$$

In mathematical expression (3), $\mu_W$ denotes the bit-shift applied by the bit-shifter 144. Further, it is assumed that $\theta_0 = 0$. After convergence, the signal propagation delay data will be $$\theta = \omega \Delta \qquad (4)$$

such that the resulting phase of the digital reference data $r_n$ matches the signal propagation delay $\Delta$ over the supply path 130. Prior to inputting the sample of the signal propagation delay data $\theta_n$ into the NCO 141, the sample of the signal propagation delay data $\theta_n$ is delayed by one sample period by means of delay circuit 146.

The error data $\in_n$ indicating the quantization error of the ADC 110 is given as follows:

$$\in_n = -\cos(\omega n T_s + \theta) + WA \cos(\omega(nT_s + \Delta)) + v_n \qquad (5)$$

$T_s$ denotes the sample frequency of the system, ω denotes the angular frequency, and $v_n$ denotes the summed errors of the ADC 110 and the DAC 120.

As can be seen from mathematical expression (5), both cosine-terms cancel out once the gain correction data W and the signal propagation delay data θ converged. Therefore, the error data $\in_n$ merely depend on the errors of the ADC 110 and the DAC 120. Assuming that the DAC 120 error can be neglected, the error data $\in_n$ merely depend on the error/inaccuracy of the ADC 110.

For example, the self-calibrated ADC 110 may produce a quantized sinewave that is subsequently compared with the digital representation of the input RF test signal 121 (i.e. the digital reference data $r_n$) after gain and phase correction in order to measure the quantization error of the ADC 110. This may, e.g., allow to directly measure the Effective Number Of Bits (ENOB) of the ADC 110 at a high RF input frequency. Accordingly, the ADC 110 may be classified based on its quantization error or any quantity derived therefrom.

Figure 5:
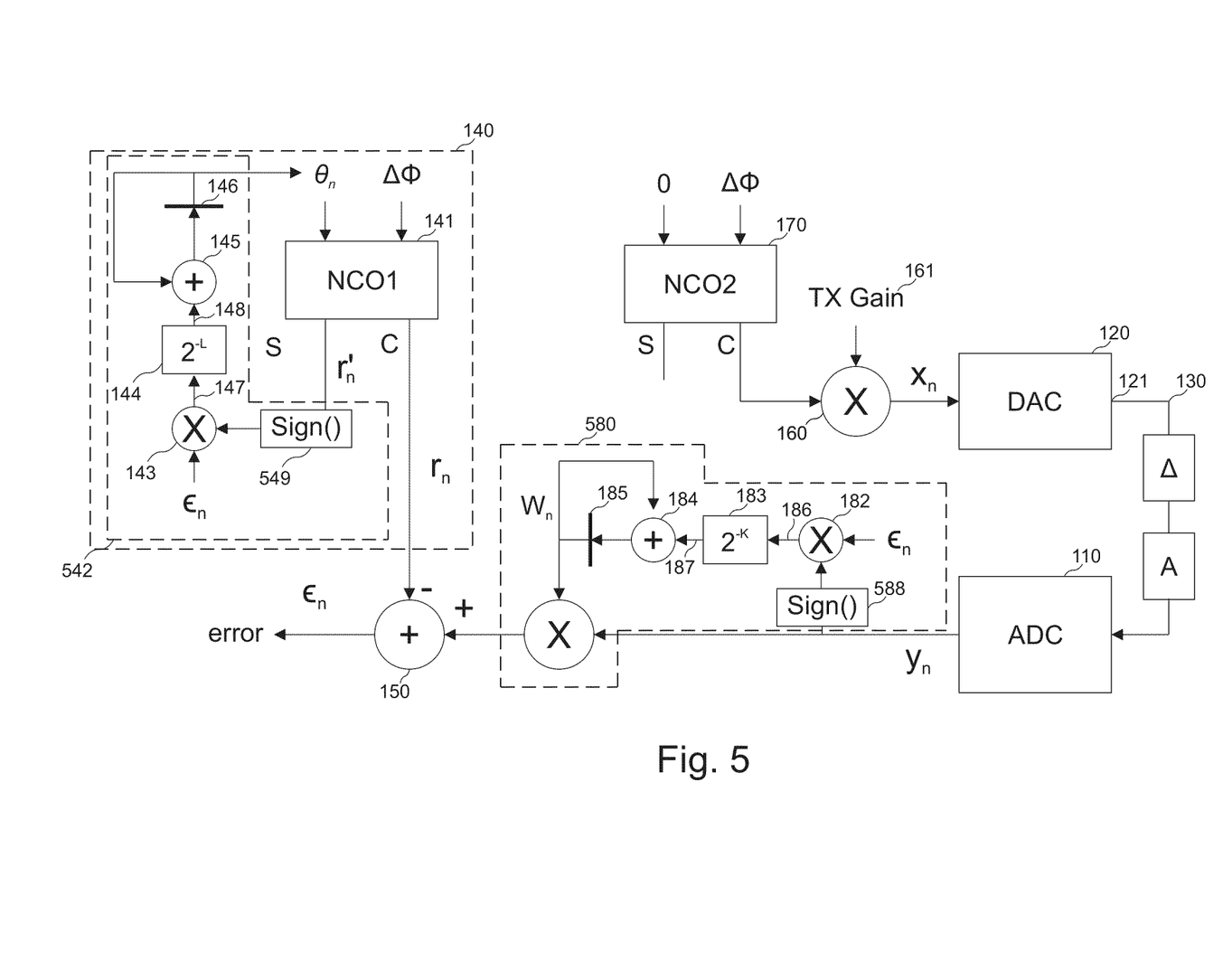
FIG. 5 illustrates a second (multiplier-less) example of a semiconductor chip providing on-chip self-testing of an ADC implemented in the semiconductor chip.

FIG. 5 illustrates another semiconductor chip 500. In the example of FIG. 5, the gain correction circuit and the loop circuitry are implemented slightly different compared to the semiconductor chip 100 illustrated in FIG. 1.

Compared to the gain correction circuit 180 illustrated in FIG. 1, the gain correction circuit 580 illustrated in FIG. 5 additionally comprises a signum circuit 588 configured to determine (calculate) the signum function of the sample of the digital output data $y_n$. Therefore, the multiplier circuit 182 of the gain correction circuit 580 is configured to combine the sample of the error data $\in_n$ and the signum function of the sample of the digital output data $y_n$ in order to obtain the first sample 186, therefore implemented as a multiplier-less operation to reduce cost.

Similarly, the loop circuitry 542 illustrated in FIG. 5 additionally comprises a signum circuit 549 compared to the loop circuitry 142 illustrated in FIG. 1. The signum circuit 549 is configured to determine (calculate) the signum function of the sample of the phase shifted replica $r'_n$ of the digital reference data. Therefore, the multiplier circuit 143 of the loop circuitry 542 is configured to combine the sample of the error data $\in_n$ and the signum function of the sample of the phase shifted replica $r'_n$ of the digital reference data in order to obtain the second sample 147.

Accordingly, the above mathematical expressions (1) and (3) change to:

$$W_n = W_{n-1} - \mu_W \in_n \text{sign}(y_n) \qquad (6)$$

and $$\theta_n = \theta_{n-1} - \mu_\theta \in_n \text{sign}(r'_n) \qquad (7)$$

Other than that, the semiconductor chip 500 is identical to the semiconductor chip 100.

Figure 6:
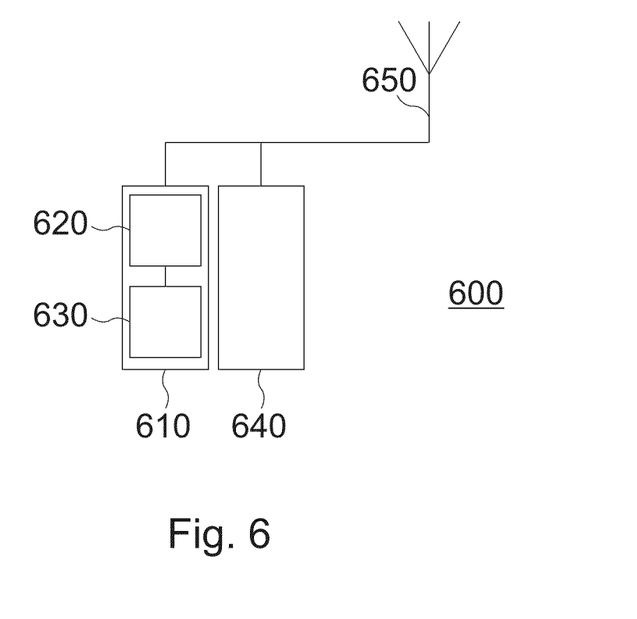
FIG. 6 illustrates an example of a base station.

An example of an implementation using a semiconductor chip according to one or more aspects of the architecture described above in connection with FIGS. 1 to 5 or one or more examples described above in connection with FIGS. 1 to 5 is illustrated in FIG. 6. FIG. 6 schematically illustrates an example of a radio base station 600 (e.g. for a femtocell, a picocell, a microcell or a macrocell) comprising a semiconductor chip 630 as proposed.

The semiconductor chip 630 is part of a receiver 610. The receiver 610 additionally comprises analog circuitry 620 configured to receive an RF receive signal from an antenna element 650 of the base station 600 (either directly or indirectly via one or more intermediate elements such as a filter). The analog circuitry 630 comprises circuitry for processing the RF receive signal such as a Low Noise Amplifier (LNA) for amplifying the RF receive signal. The analog circuitry 620 is configured to supply the RF receive signal for digitization to the ADC implemented in the semiconductor chip 630. In some examples, the analog circuitry 620 may be implemented in the semiconductor chip 630.

Further, the base station 600 comprises a transmitter 640 configured to generate a RF transmit signal. The transmitter 640 may use the antenna element 650 or another antenna element (not illustrated) of the base station 600 for radiating the RF transmit signal to the environment. Although illustrated separately in FIG. 6 in order to highlight the respective functionality, the receiver 610 and the transmitter 640 may at least in part be implemented in the same semiconductor chip (e.g. the semiconductor chip 630).

To this end, a base station with a semiconductor chip providing on-chip self-testing of the implemented ADC may be provided.

The base station 600 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (10), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 7:
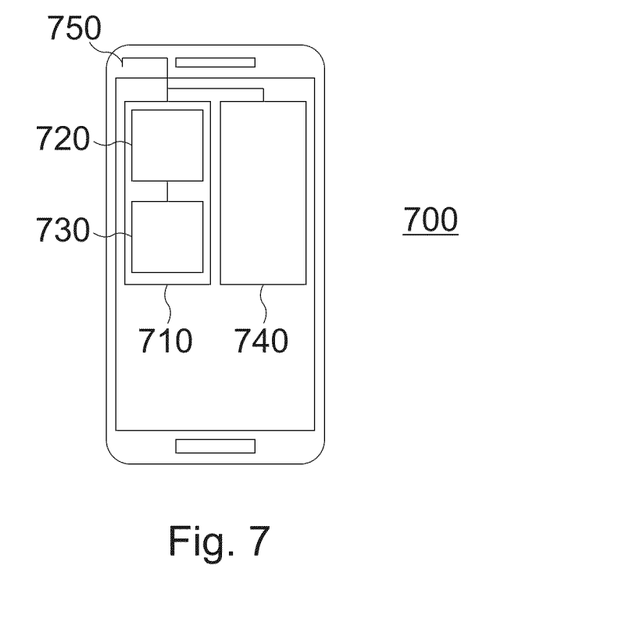
FIG. 7 illustrates an example a mobile device.

Another example of an implementation using a semiconductor chip according to one or more aspects of the architecture described above in connection with FIGS. 1 to 5 or one or more examples described above in connection with FIGS. 1 to 5 is illustrated in FIG. 7. FIG. 7 schematically illustrates an example of a mobile device 700 (e.g. mobile phone, smartphone, tablet-computer, or laptop) comprising a semiconductor chip 730 as proposed.

The semiconductor chip 730 is part of a receiver 710. The receiver 610 additionally comprises analog circuitry 720 configured to receive a RF receive signal from an antenna element 750 of the base station 700 (either directly or indirectly via one or more intermediate elements such as a filter). The analog circuitry 730 comprises circuitry for processing the RF receive signal such as an LNA for amplifying the RF receive signal. The analog circuitry 720 is configured to supply the RF receive signal for digitization to the ADC implemented in the semiconductor chip 730. In some examples, the analog circuitry 720 may be implemented in the semiconductor chip 730.

Further, the mobile device 700 comprises a transmitter 740 configured to generate a RF transmit signal. The transmitter 740 may use the antenna element 750 or another antenna element (not illustrated) of the mobile device 700 for radiating the RF transmit signal to the environment. Although illustrated separately in FIG. 7 in order to highlight the respective functionality, the receiver 710 and the transmitter 740 may at least in part be implemented in the same semiconductor chip (e.g. the semiconductor chip 730).

To this end, a mobile device with a semiconductor chip providing on-chip self-testing of the implemented ADC may be provided.

The mobile device 700 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, $I^2C$ or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using an ADC system according to the proposed architectures or one or more of the examples described above may be configured to operate according to one of the 3GPP-standardized mobile communication networks or systems. The mobile or wireless communication system may correspond to, for example, a 5G NR, a LongTerm Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

For further illustrating the on-chip self-testing of the implemented ADC described above, FIG. 8 illustrates a flowchart of a method 800 for on-chip self-testing of an ADC. The method 800 comprises generating 802 an RF test signal using a DAC implemented in the same semiconductor chip as the ADC. Further, the method 800 comprises supplying 804 the RF test signal to the ADC via a supply path. Additionally, the method 800 comprises generating 806 digital output data based on the RF test signal by the ADC. The method 800 comprises generating 808 digital reference data using a reference data generation circuit implemented in the semiconductor chip. Further, the method 800 comprises comparing 810 the digital output data to the digital reference using a comparator circuit implemented in the semiconductor chip in order to determine error data indicative of a quantization error of the ADC.

Figure 8:
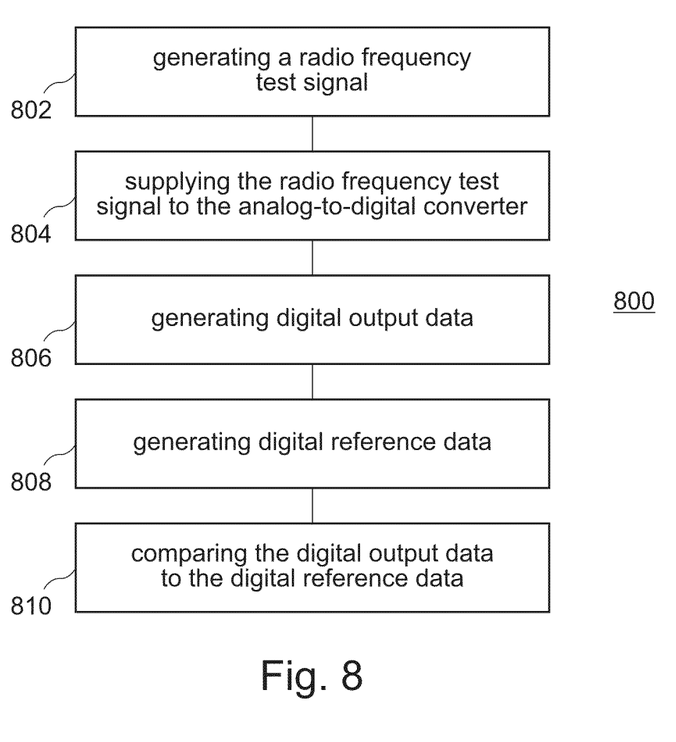
FIG. 8 illustrates a flowchart of an example of a method for on-chip self-testing of an ADC.

The method 800 may allow to eliminate the need for expensive test equipment for testing the ADC. Further, the test time may be reduced drastically compared to conventional approaches. Therefore, the method 800 may allow to perform high performance self-testing at wafer-level probe testing during high volume manufacture.

More details and aspects of the method 800 are explained in connection with the proposed technique or one or more examples described above (e.g. FIGS. 1 and 5). The method 800 may comprise one or more additional optional features corresponding to one or more aspects of the proposed technique or one or more examples described above.

The examples described herein may be summarized as follows:

Example 1 is a semiconductor chip providing on-chip self-testing of an ADC implemented in the semiconductor chip, the semiconductor chip comprising: the ADC; a DAC configured to generate and supply a radio frequency test signal to the ADC via a supply path, wherein the ADC is configured to generate digital output data based on the radio frequency test signal; a reference data generation circuit configured to generate digital reference data; and a comparator circuit configured to compare the digital output data to the digital reference data in order to determine error data.

Example 2 is the semiconductor chip of example 1, wherein the error data is indicative of a quantization error of the ADC.

Example 3 is the semiconductor chip of example 1 or example 2, wherein the DAC is a 1-bit DAC with a mixed-signal finite impulse response filter output stage.

Example 4 is the semiconductor chip of any of examples 1 to 3, wherein the radio frequency test signal is a sinusoidal signal.

Example 5 is the semiconductor chip of any of examples 1 to 4, further comprising: a gain correction circuit configured to modify, based on gain correction data, the digital output data in order to compensate for a signal gain of the supply path, wherein the gain correction circuit is coupled between the ADC and the comparator circuit.

Example 6 is the semiconductor chip of example 5, wherein the gain correction circuit is further configured to determine the gain correction data based on the error data and the digital output data.

Example 7 is the semiconductor chip of example 6, wherein the gain correction circuit is configured to determine the gain correction by: combining a sample of the error data and a sample of the digital output data in order to obtain a first sample; bit-shifting the first sample; and obtaining a sample of the gain correction data by combining the bit-shifted first sample with a preceding sample of the gain correction data.

Example 8 is the semiconductor chip of example 7, wherein the gain correction circuit is configured to combine the sample of the error data and the sample of the digital output data by combining the sample of the error data and the signum function of the sample of the digital output data.

Example 9 is the semiconductor chip of example 7 or example 8, wherein the gain correction circuit is configured to determine the gain correction data by further delaying the sample of the gain correction data.

Example 10 is the semiconductor chip of any of examples 1 to 9, wherein the reference data generation circuit is configured to generate the digital reference data taking into account a signal propagation delay over the supply path.

Example 11 is the semiconductor chip of any of examples 1 to 10, wherein the reference data generation circuit comprises a numerically controlled oscillator configured to generate the digital reference data based on frequency control data.

Example 12 is the semiconductor chip of example 11, wherein the numerically controlled oscillator is further configured to generate the digital reference data based on signal propagation delay data indicative of a signal propagation delay over the supply path.

Example 13 is the semiconductor chip of example 12, wherein the numerically controlled oscillator comprises: a first input node for the frequency control data; a second input for the signal propagation delay data; a first combiner circuit configured to combine a sample of the frequency control data with a phase accumulation sample in order to generate an updated phase accumulation sample, wherein the phase accumulation sample is an accumulation of preceding samples of the frequency control data, a delay circuit configured to delay the updated phase accumulation sample; a second combiner circuit configured to combine a sample of the signal propagation delay data and the delayed updated phase accumulation sample in order to generate a control sample; and a CORDIC circuit configured to generate the digital reference data based on the control sample.

Example 14 is the semiconductor chip of example 13, wherein the numerically controlled oscillator further comprises a quantizer circuit coupled between the second combiner circuit and the CORDIC circuit and configured to quantize the control sample.

Example 15 is the semiconductor chip of example 13 or example 14, wherein the CORDIC circuit is further configured to generate a phase shifted replica of the digital reference data.

Example 16 is the semiconductor chip of any of examples 12 to 15, wherein the reference data generation circuit comprises loop circuitry configured to generate the signal propagation delay data based on the error data and a phase shifted replica of the digital reference data, wherein the phase shifted replica of the digital reference data is output by the numerically controlled oscillator.

Example 17 is the semiconductor chip of example 16, wherein the loop circuitry is configured to generate the signal propagation delay data by: combining a sample of the error data and a sample of the phase shifted replica of the digital reference data in order to obtain a second sample; bit-shifting the second sample; and obtaining a sample of the signal propagation delay data by combining the bit-shifted second sample with a preceding sample of the signal propagation delay data.

Example 18 is the semiconductor chip of example 17, wherein the loop circuitry is configured to combine the sample of the error data and the sample of the phase shifted replica of the digital reference data by combining the sample of the error data and the signum function of the sample of the phase shifted replica of the digital reference data.

Example 19 is the semiconductor chip of example 17 or example 18, wherein the loop circuitry is configured to generate the signal propagation delay data by further delaying the sample of the signal propagation delay data.

Example 20 is the semiconductor chip of any of examples 16 to 19, wherein the phase shifted replica of the digital reference data is phase-shifted by 90° with respect to the digital reference data.

Example 21 is the semiconductor chip of any of examples 1 to 20, wherein the DAC is configured to generate the radio frequency test signal based on digital control data, and wherein the semiconductor chip further comprises a numerically controlled oscillator configured to generate the digital control data.

Example 22 is the semiconductor chip of example 21, wherein the numerically controlled oscillator is configured to generate the digital control data based on frequency control data.

Example 23 is the semiconductor chip of example 21 or 22, further comprising: a modification circuit configured to modify the digital control data based on gain control data, wherein the modification circuit is coupled between the numerically controlled oscillator and the DAC.

Example 24 is a receiver, comprising: a semiconductor chip according to any of examples 1 to 23; and analog circuitry configured to receive a radio frequency receive signal from an antenna element, and to supply the radio frequency receive signal for digitization to the ADC.

Example 25 is the receiver of example 24, wherein the analog circuitry comprises a low noise amplifier configured to amplify the radio frequency receive signal.

Example 26 is a base station, comprising: a receiver according to example 24 or example 25; and a transmitter configured to generate a radio frequency transmit signal.

Example 27 is the base station of example 26, further comprising at least one antenna element coupled to at least one of the receiver and the transmitter.

Example 28 is a mobile device, comprising: a receiver according to example 24 or example 25; and a transmitter configured to generate a radio frequency transmit signal.

Example 29 is the mobile device of example 28, further comprising at least one antenna element coupled to at least one of the receiver and the transmitter.

Example 30 is a method for on-chip self-testing of an ADC, comprising: generating a radio frequency test signal using a DAC implemented in the same semiconductor chip as the ADC; supplying the radio frequency test signal to the ADC via a supply path; generating digital output data based on the radio frequency test signal by the ADC; generating digital reference data using a reference data generation circuit implemented in the semiconductor chip; and comparing the digital output data to the digital reference using a comparator circuit implemented in the semiconductor chip in order to determine error data.

Example 31 is the method of example 30, wherein the error data is indicative of a quantization error of the ADC.

Example 32 is the method of example 30 or example 31, wherein the DAC is a 1-bit DAC with a mixed-signal finite impulse response filter output stage.

Example 33 is the method of any of examples 30 to 32, wherein the radio frequency test signal is a sinusoidal signal.

Example 34 is the method of any of examples 30 to 33, further comprising: modifying, based on gain correction data, the digital output data using a gain correction circuit prior to comparing the digital output data to the digital reference data in order to compensate for a signal gain of the supply path, wherein the gain correction circuit is implemented in the semiconductor chip.

Example 35 is the method of example 34, further comprising: determining the gain correction data based on the error data and the digital output data.

Example 36 is the method of example 35, wherein determining the gain correction data comprises: combining a sample of the error data and a sample of the digital output data in order to obtain a first sample; bit-shifting the first sample; and obtaining a sample of the gain correction data by combining the bit-shifted first sample with a preceding sample of the gain correction data.

Example 37 is the method of example 36, wherein combining the sample of the error data and the sample of the digital output data comprises combining the sample of the error data and the signum function of the sample of the digital output data.

Example 38 is the method of example 36 or example 37, wherein determining the gain correction data further comprises: delaying the sample of the gain correction data.

Example 39 is the method of any of examples 30 to 38, wherein the digital reference data is generated taking into account a signal propagation delay of the radio frequency test signal over the supply path.

Example 40 is the method of any of examples 30 to 39, wherein the digital reference data is generated by a numerically controlled oscillator of the reference data generation circuit based on frequency control data.

Example 41 is the method of example 40, wherein the digital reference data is generated by the numerically controlled oscillator further based on signal propagation delay data indicative of a signal propagation delay of the radio frequency test signal over the supply path.

Example 42 is the method of example 41, wherein for generating the digital reference data the numerically controlled oscillator: combines a sample of the frequency control data with a phase accumulation sample in order to generate an updated phase accumulation sample, wherein the phase accumulation sample is an accumulation of preceding samples of the frequency control data; delays the updated phase accumulation sample; combines a sample of the signal propagation delay data and the delayed updated phase accumulation sample in order to generate a control sample; and generates the digital reference data based on the control sample using a CORDIC algorithm.

Example 43 is the method of example 42, wherein the control sample is quantized prior to inputting the control sample into the CORDIC algorithm.

Example 44 is the method of example 42 or example 43, wherein the CORDIC algorithm further generates a phase shifted replica of the digital reference data.

Example 45 is the method of any of examples 41 to 44, further comprising: generating the signal propagation delay data based on the error data and a phase shifted replica of the digital reference data, wherein the phase shifted replica of the digital reference data is output by the numerically controlled oscillator.

Example 46 is the method of example 45, wherein generating the signal propagation delay data comprises: combining a sample of the error data and a sample of the phase shifted replica of the digital reference data in order to obtain a second sample; bit-shifting the second sample; and obtaining a sample of the signal propagation delay data by combining the bit-shifted second sample with a preceding sample of the signal propagation delay data.

Example 47 is the method of example 46, wherein combining the sample of the error data and the sample of the phase shifted replica of the digital reference data comprises combining the sample of the error data and the signum function of the sample of the phase shifted replica of the digital reference data.

Example 48 is the method of example 46 or example 47, wherein generating the signal propagation delay data further comprises: delaying the sample of the signal propagation delay data.

Example 49 is the method of any of examples 45 to 48, wherein the phase shifted replica of the digital reference data is phase-shifted by 90° with respect to the digital reference data.

Example 50 is the method of any of examples 30 to 49, wherein the DAC generates the radio frequency test signal based on digital control data, and wherein the method further comprises generating the digital control data using a numerically controlled oscillator.

Example 51 is the method of example 50, wherein the digital control data is generated by the numerically controlled oscillator based on frequency control data.

Example 52 is the method of example 50 or example 51, further comprising: modifying the digital control data based on gain control data prior to supplying the digital control data to the DAC.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor chip providing on-chip self-testing of an analog-to-digital converter implemented in the semiconductor chip, the semiconductor chip comprising:
   the analog-to-digital converter;
   a digital-to-analog converter configured to generate and supply a radio frequency test signal to the analog-to-digital converter via a supply path, wherein the analog-to-digital converter is configured to generate digital output data based on the radio frequency test signal;
   a reference data generation circuit configured to generate digital reference data; and
   a comparator circuit configured to compare the digital output data to the digital reference data in order to determine error data.

2. The semiconductor chip of claim 1, wherein the error data is indicative of a quantization error of the analog-to-digital converter.

3. The semiconductor chip of claim 1, wherein the digital-to-analog converter is a 1-bit digital-to-analog converter with a mixed-signal finite impulse response filter output stage.

4. The semiconductor chip of claim 1, wherein the radio frequency test signal is a sinusoidal signal.

5. The semiconductor chip of claim 1, further comprising:
   a gain correction circuit configured to modify, based on gain correction data, the digital output data in order to compensate for a signal gain of the supply path,
   wherein the gain correction circuit is coupled between the analog-to-digital converter and the comparator circuit.

6. The semiconductor chip of claim 5, wherein the gain correction circuit is further configured to determine the gain correction data based on the error data and the digital output data.

7. The semiconductor chip of claim 6, wherein the gain correction circuit is configured to determine the gain correction by:
   combining a sample of the error data and a sample of the digital output data in order to obtain a first sample;
   bit-shifting the first sample; and
   obtaining a sample of the gain correction data by combining the bit-shifted first sample with a preceding sample of the gain correction data.

8. The semiconductor chip of claim 7, wherein the gain correction circuit is configured to combine the sample of the error data and the sample of the digital output data by combining the sample of the error data and the signum function of the sample of the digital output data.

9. The semiconductor chip of claim 7, wherein the gain correction circuit is configured to determine the gain correction data by further delaying the sample of the gain correction data.

10. The semiconductor chip of claim 1, wherein the reference data generation circuit is configured to generate the digital reference data taking into account a signal propagation delay over the supply path.

11. The semiconductor chip of claim 1, wherein the reference data generation circuit comprises a numerically controlled oscillator configured to generate the digital reference data based on frequency control data.

12. The semiconductor chip of claim 11, wherein the numerically controlled oscillator is further configured to generate the digital reference data based on signal propagation delay data indicative of a signal propagation delay over the supply path.

13. The semiconductor chip of claim 12, wherein the numerically controlled oscillator comprises:
   a first input node for the frequency control data;
   a second input for the signal propagation delay data;
   a first combiner circuit configured to combine a sample of the frequency control data with a phase accumulation sample in order to generate an updated phase accumulation sample, wherein the phase accumulation sample is an accumulation of preceding samples of the frequency control data,
   a delay circuit configured to delay the updated phase accumulation sample;
   a second combiner circuit configured to combine a sample of the signal propagation delay data and the delayed updated phase accumulation sample in order to generate a control sample; and
   a CORDIC circuit configured to generate the digital reference data based on the control sample.

14. The semiconductor chip of claim 13, wherein the numerically controlled oscillator further comprises a quantizer circuit coupled between the second combiner circuit and the CORDIC circuit and configured to quantize the control sample.

15. The semiconductor chip of claim 13, wherein the CORDIC circuit is further configured to generate a phase shifted replica of the digital reference data.

16. The semiconductor chip of claim 12, wherein the reference data generation circuit comprises loop circuitry configured to generate the signal propagation delay data based on the error data and a phase shifted replica of the digital reference data, wherein the phase shifted replica of the digital reference data is output by the numerically controlled oscillator.

17. The semiconductor chip of claim 16, wherein the loop circuitry is configured to generate the signal propagation delay data by:
   combining a sample of the error data and a sample of the phase shifted replica of the digital reference data in order to obtain a second sample;
   bit-shifting the second sample; and
   obtaining a sample of the signal propagation delay data by combining the bit-shifted second sample with a preceding sample of the signal propagation delay data.

18. The semiconductor chip of claim 17, wherein the loop circuitry is configured to combine the sample of the error data and the sample of the phase shifted replica of the digital reference data by combining the sample of the error data and the signum function of the sample of the phase shifted replica of the digital reference data.

19. The semiconductor chip of claim 17, wherein the loop circuitry is configured to generate the signal propagation delay data by further delaying the sample of the signal propagation delay data.

20. The semiconductor chip of claim 16, wherein the phase shifted replica of the digital reference data is phase-shifted by 90° with respect to the digital reference data.

21. The semiconductor chip of claim 1, wherein the digital-to-analog converter is configured to generate the radio frequency test signal based on digital control data, and wherein the semiconductor chip further comprises a numerically controlled oscillator configured to generate the digital control data.

22. A receiver, comprising:
a semiconductor chip according to claim 1; and
analog circuitry configured to receive a radio frequency receive signal from an antenna element, and to supply the radio frequency receive signal for digitization to the analog-to-digital converter.

23. A base station, comprising:
a receiver according to claim 22;
and a transmitter configured to generate a radio frequency transmit signal.

24. A mobile device, comprising:
a receiver according to claim 22;
and a transmitter configured to generate a radio frequency transmit signal.

25. A method for on-chip self-testing of an analog-to-digital converter, comprising:
generating a radio frequency test signal using a digital-to-analog converter implemented in the same semiconductor chip as the analog-to-digital converter;
supplying the radio frequency test signal to the analog-to-digital converter via a supply path;
generating digital output data based on the radio frequency test signal by the analog-to-digital converter;
generating digital reference data using a reference data generation circuit implemented in the semiconductor chip; and
comparing the digital output data to the digital reference using a comparator circuit implemented in the semiconductor chip in order to determine error data.

* * * * *